United States Patent [19]
Yoshida et al.

[11] Patent Number: 5,416,340
[45] Date of Patent: May 16, 1995

[54] THIN FILM TRANSISTOR AND ACTIVE MATRIX LIQUID CRYSTAL DISPLAY DEVICE HAVING REDUCED PHOTOELECTRIC LEAKAGE CURRENT DUE TO INCIDENT LIGHT

[75] Inventors: Toshihiko Yoshida, Yokohama; Masakazu Atsumi, Machida; Takeshi Matsumoto, Fujisawa, all of Japan

[73] Assignee: International Business Machines Corporation, Armonk, N.Y.

[21] Appl. No.: 71,746

[22] Filed: Jun. 9, 1993

[30] Foreign Application Priority Data

Jun. 9, 1992 [JP] Japan .................. 4-147859

[51] Int. Cl.[6] .................................. H01L 27/01
[52] U.S. Cl. ........................ 257/59; 257/349; 359/59
[58] Field of Search .............. 359/59, 54; 257/57, 257/59, 347, 349, 352

[56] References Cited

U.S. PATENT DOCUMENTS

| | | | |
|---|---|---|---|
| 4,857,907 | 8/1989 | Koden | 359/59 |
| 4,935,792 | 6/1990 | Tanaka et al. | 257/59 |
| 5,047,819 | 9/1991 | Tanaka et al. | 257/352 |
| 5,053,347 | 10/1991 | Wu | 357/57 |
| 5,065,202 | 11/1991 | Tanaka et al. | 257/59 |
| 5,111,261 | 5/1992 | Tanaka et al. | 257/349 |
| 5,121,177 | 6/1992 | Tanaka et al. | 257/349 |
| 5,187,551 | 2/1993 | Shoji et al. | 359/59 |
| 5,191,451 | 3/1993 | Katayama et al. | 359/59 |

FOREIGN PATENT DOCUMENTS

| | | | |
|---|---|---|---|
| 1-219825 | 9/1989 | Japan | 257/57 |
| 2-83981 | 3/1990 | Japan | 257/349 |
| 2-271576 | 11/1990 | Japan | 257/349 |

*Primary Examiner*—Robert P. Limanek
*Assistant Examiner*—Minhloan Tran
*Attorney, Agent, or Firm*—David Aker; Ronald L. Drumheller

[57] ABSTRACT

Leakage current due to light incident upon the semiconductor layer which forms the channel of a TFT is eliminated. An insulating layer is formed between one of source and drain electrodes and the semiconductor layer over a distance which is longer than a hole-electron recombination distance, from all the edges of at least one of the source and drain electrodes of the TFT so that it overlaps the semiconductor layer.

7 Claims, 7 Drawing Sheets

FIG. 1A
○ SEMICONDUCTOR LAYER 5
× N⁺ AMORPHOUS Si LAYER 9
△ INSULATING LAYER 6

○ SEMICONDUCTOR LAYER 5
× N⁺ AMORPHOUS Si LAYER 9
△ INSULATING LAYER 6

○ SEMICONDUCTOR LAYER 5
× N⁺ AMORPHOUS Si LAYER 9
△ INSULATING LAYER 6

THIN FILM TRANSISTOR AND ACTIVE MATRIX LIQUID CRYSTAL DISPLAY DEVICE HAVING REDUCED PHOTOELECTRIC LEAKAGE CURRENT DUE TO INCIDENT LIGHT

FIELD OF THE INVENTION

The present invention relates to a thin film transistor and an active matrix liquid crystal display device. More particularly it relates to preventing photoelectric leakage current generated between source and drain electrodes of a TFT due to incident light.

BACKGROUND OF THE INVENTION

In general, an active matrix liquid crystal display device having a thin film transistor comprises a plurality of scanning lines (gate lines) and a plurality of signal lines (data lines) disposed in the horizontal and the vertical direction respectively, a thin film transistor (TFT) as a non-linear element at each of the intersections of the scanning and signal lines, and one transparent insulating substrate having a transparent display electrode connected to each thin film transistor. The other transparent insulating substrate has a color filter, a common electrode, and a reflecting metal black matrix. Liquid crystal materials are maintained between these two transparent insulating substrates. A light source radiates light from the back of one transparent insulating substrate toward the other transparent insulating substrate. A driver device applies scanning voltage to said scanning lines, and another driver device applies signal voltage to said signal lines. The transparent display electrode and the TFT are formed for each liquid crystal cell which forms a pixel element, and optical characteristics for each pixel are modulated according to the magnitude of the scanning and signal voltage.

Figure 1A:
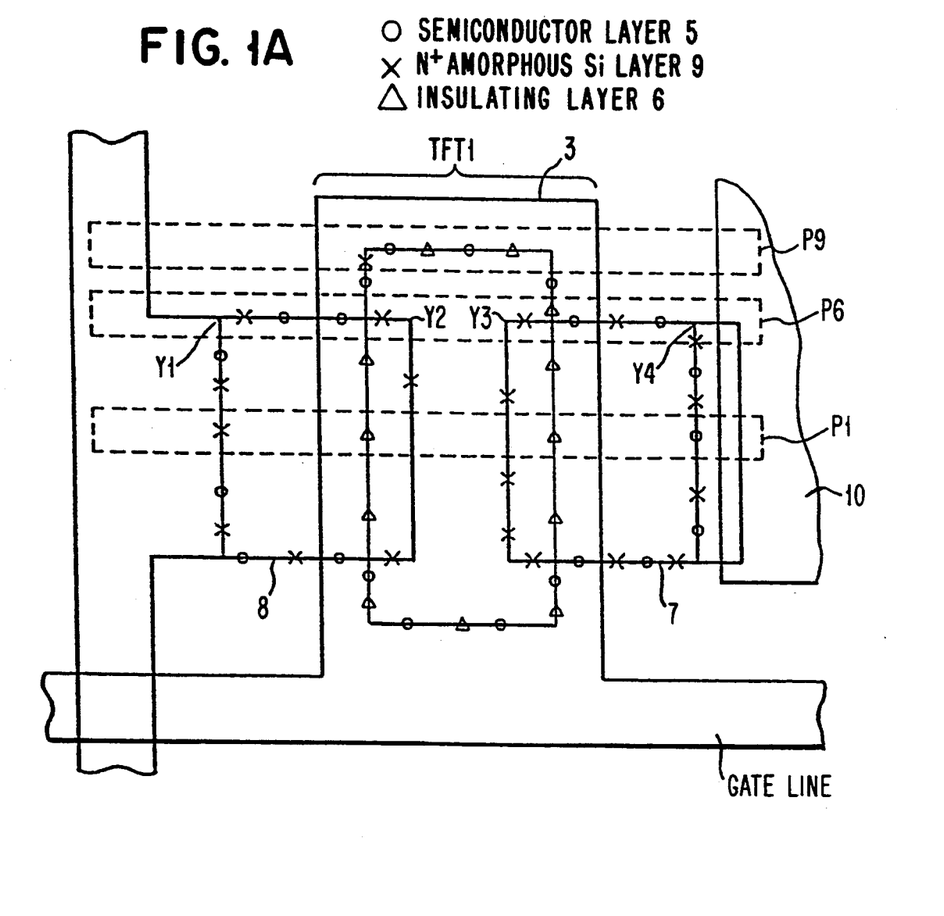
FIG. 1A is an enlarged plan view of a conventional TFT.
Figure 1B:
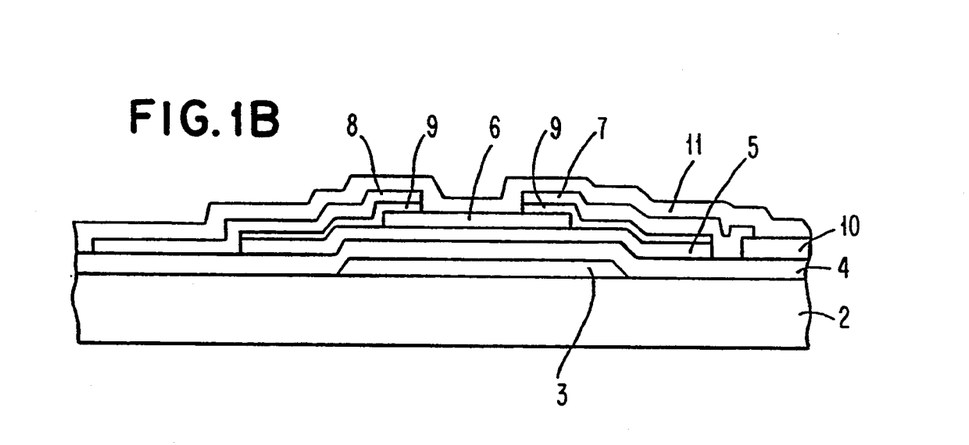
FIG. 1B is a cross sectional view of the conventional TFT of FIG. 1A.

A TFT has been recently proposed in which a channel protective insulating layer is formed on a semiconductor layer serving as a channel so as to prevent the semiconductor layer from being etched. FIG. 1A shows an enlarged plan view and FIG. 1B shows a sectional view of a TFT structure made by the inventors of the present invention. A thin film transistor 1 includes a light shielding gate electrode 3 connected to said scanning lines and formed on an insulating substrate 2 such as a glass substrate, a gate insulator film 4 formed to cover the gate electrode 3, a semiconductor layer 5 formed on the gate insulator film 4 for operating as a channel, a channel protective insulator film 6 formed on a part of the semiconductor layer 5, and a source electrode 7 and a drain electrode 8 connected to said signal lines and electrically contacting said semiconductor layer 5. The source electrode 7 and the drain electrode 8 are light shielding metal layers such as aluminum and may also have an N+amorphous silicon layer 9 so as to maintain good ohmic contact with the semiconductor layer 5. The transistor uses as materials of the semiconductor layer 5 intrinsic amorphous silicon (a-Si), polycrystal silicon (p-Si) and the like. The channel protective insulator film 6 which determines the length of the channel is needed to prevent the thin semiconductor layer 5 from being etched and is formed by a nitride film and the like. It is known that leakage current is caused in the intrinsic amorphous silicon semiconductor layer 5 due to incident light from a surface, which is emitted from a light source, passes through liquid crystal materials, reflects on the inner surface of the other transparent insulating substrate, and passes through a transparent nitride film. This is because holes and electrons are generated when light is projected into an intrinsic amorphous silicon layer. This leakage current causes no problem when the TFT is turned on. However, when the leakage current flows between source and drain electrodes when the TFT is turned off, the voltage applied to the liquid crystal is changed and consequently display quality is remarkably degraded.

Figure 2A:
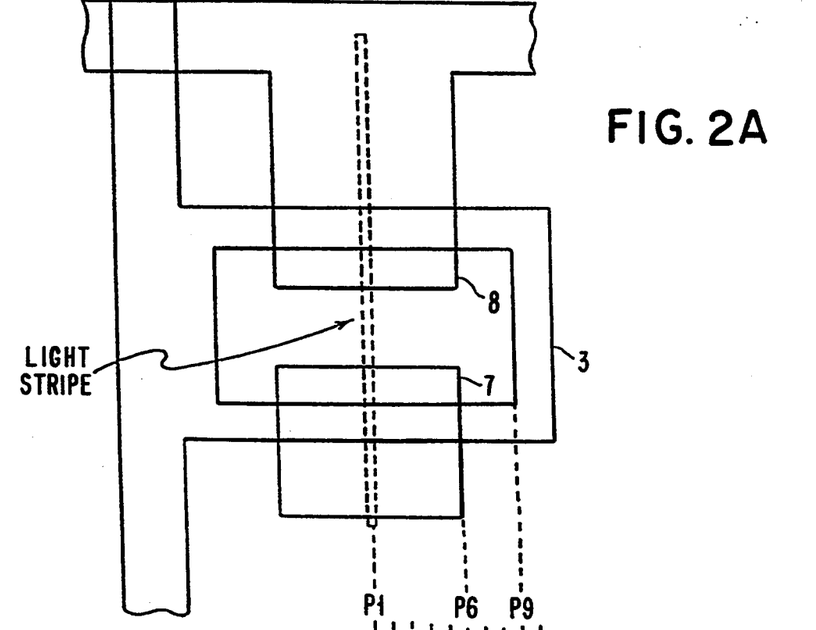
FIG. 2A is an enlarged plan view of the TFT of FIG. 1A with a light stripe impinging thereon.
Figure 2B:
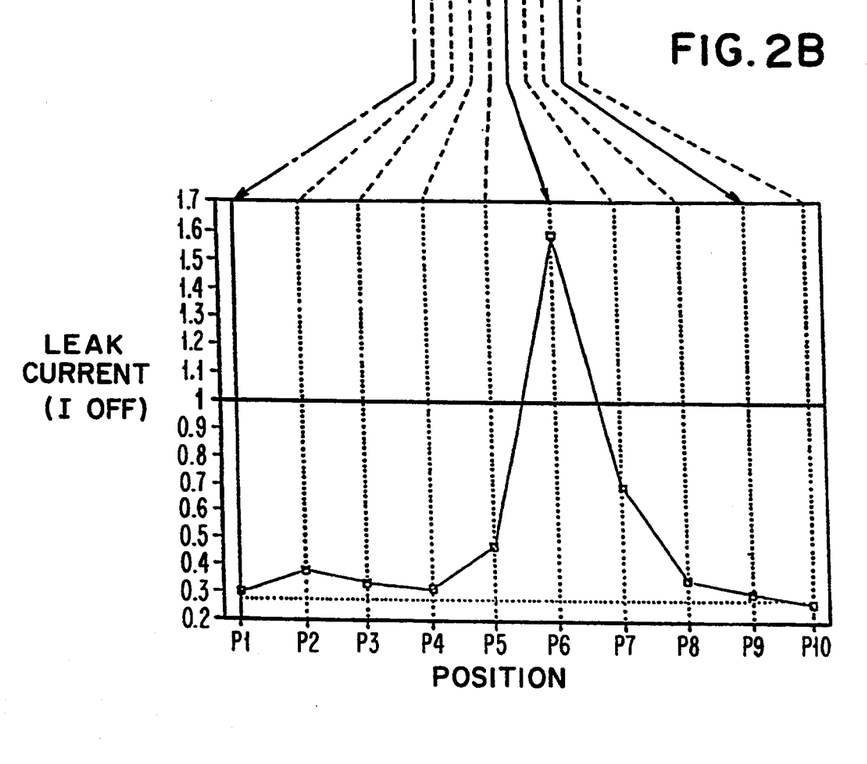
FIG. 2B is a graph showing the measurements of leakage current of the TFT of FIG. 2A.

Accordingly, the inventors of the present invention conducted the following experiment to determine which path in the TFT the leak current flows through. First, the TFT was placed in a dark box and current during the turn off period of the TFT (Ioff) was measured. This OFF-state current is about $10^{-12}$A in a TFT of normal size. Then, the OFF-state current between source and drain electrodes was measured by moving a narrow light stripe from a position P1 to a position P10 in order as shown in FIGS. 2A and 2B FIG. 2B shows the result of the experiment. The abscissa shows positions and the ordinate shows OFF-state current. The value of the OFF-state current Ioff is represented by a logarithmic value. Further, the value of the OFF-state current is represented by an arbitrary scale since it depends on the intensity of projected light, and Ioff=0 is about $10^{-12}$A and Ioff=1 is about $10^{-11}$A. The OFF-state current increased by about one digit (order of magnitude) at a position P6, while the OFF-state current at positions P1 and P9 indicated small values.

In the position P1, since an overlap margin of a mask for forming source and gate electrodes during the manufacturing process is needed, the source electrode 7 and the drain electrode 8 are extended to cover the channel protective insulator film 6 by a distance of about 2 to 3 $\mu$m, which is longer than a hole-electron recombination distance, that is, about 1 $\mu$m. Therefore, if a light stripe is positioned at the position P1, holes and electrons are not generated in the semiconductor area in which light is blocked by the source electrode 7 and drain electrode 8, and holes and electrons are generated in a semiconductor area in which light is not blocked by the source electrode 7 and drain electrode 8. Since these latter holes and electrons are recombined and decay before reaching the source electrode 7 or the drain electrode 8, the leakage current between the source electrode 7 and the drain electrode 8 is very low. This very low current is dark current and has no effect on the operation of the TFT.

In the position P9, since the light stripe is positioned away from the edges of the source electrode 7 and the drain electrode 8 by a distance which is longer than a distance for recombining holes and electrons, even if holes and electrons are generated in the semiconductor area in which the light stripe is projected, these holes and electrons recombine and decay before reaching the source electrode 7 and the drain electrode 8, and consequently the leakage current between the source electrode 7 and the drain electrode 8 is very low. In the position P6, the edges of the source electrode 7 and the drain electrode 8 overlap the edges of the semiconductor layer 5. If a light stripe is positioned at position P6 within a hole-electron recombination distance, holes and electrons which are generated within semiconductor area between Y1 and Y2 and between Y3 and Y4 (FIG. 1A), in which light is not blocked by the source electrode 7, the drain electrode 8 and the channel protective insulator film 6, immediately reach the source electrode 7 and the drain electrode 8. Further, since holes and electrons generated due to incident light exist between Y2 and Y3, a path for leakage current is formed between the drain electrode 8 and the source electrode 7. Thus, the inventors of the present invention established that holes and electrons, which are generated in an area of the semiconductor layer 5 within a hole-electron recombination distance from the edges of a source electrode and those of a drain electrode overlapping the semiconductor layer 5, respectively, and which reach the source and drain electrodes, contribute to a high leakage current caused during the turn off period of the TFT. A first prior art technique for preventing leakage current is to interrupt the projection of light at the overall semiconductor layer. For example, Japanese Published Unexamined Patent Application (PUPA) No. 59-117267 discloses that an extra light shielding film is formed above a channel region between source and drain electrodes of a TFT and has a larger area than the region. However, this has a defect in that yield is decreased, since an additional process for forming the light shielding film is needed and the number of processes is increased.

A second prior art technique is disclosed in PUPA No. 3-85767, in which an extra thick semiconductor layer for recombining and decaying holes and electrons generated due to incident light is provided between a semiconductor layer serving as a channel of a TFT and source and drain electrodes. When the TFT is turned on, a large quantity of electrons is injected into the extra semiconductor layer from the source electrode to form a conducting path. This also causes the number of processes to increase and yield to decrease.

SUMMARY OF THE INVENTION

It is an object of the present invention to provide a TFT active matrix liquid crystal display device of high display quality.

It is another object of the invention to provide a method of preventing leakage current by decreasing the path of leakage current caused due to incident light on a semiconductor layer.

It is still another object of the present invention to provide a method for reducing leakage current only by changing the conventional construction of components without introducing a new process.

A thin film transistor according to the present invention includes a light shielding gate electrode formed on a transparent insulating substrate, a gate insulating layer formed on the gate electrode, a semiconductor layer formed on the gate insulating layer, and a light shielding source electrode and a light shielding drain electrode connected to the semiconductor layer for defining a channel region; and an insulating layer formed between one of the source and drain electrodes and the semiconductor layer over a distance, which is longer than a hole-electron recombination distance, from all the edges of at least one of the source and drain electrodes overlapping the semiconductor layer. The insulating layer is extended onto the channel region of the semiconductor layer.

DETAILED DESCRIPTION OF THE PREFERRED EMBODIMENT

An active matrix liquid crystal display device has two transparent insulating substrates and liquid crystal materials maintained between the two. One transparent insulating substrate has a plurality of gate lines disposed in the horizontal direction, a plurality of signal lines disposed in the vertical direction, and liquid crystal display cells formed at each intersection of the gate and signal lines thereon. Formed on the other transparent insulating substrate is a common electrode. A gate signal source is connected to the gate lines for applying gate signals to the gate lines, and a data signal source is connected to the signal lines for applying data signals to the signal lines.

Figure 3:
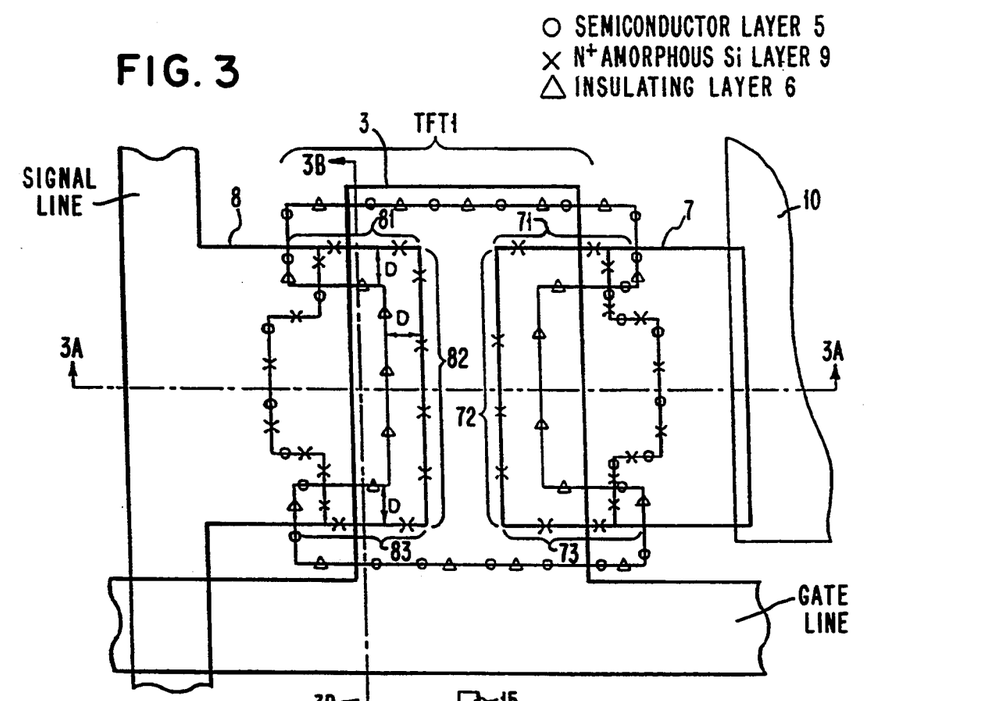
FIG. 3 is an enlarged plan view of a first embodiment of a TFT according to the present invention.
Figure 3A:
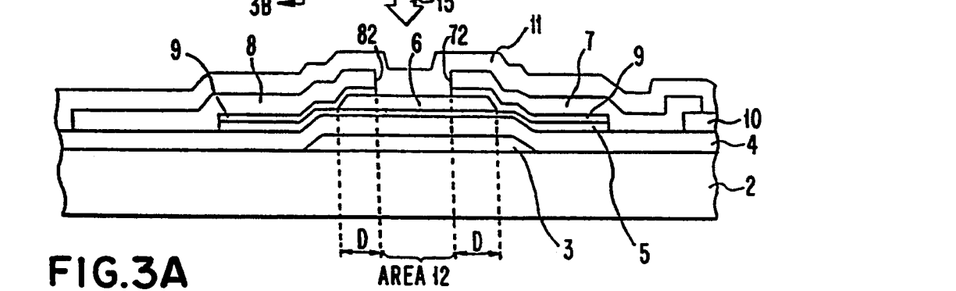
FIG. 3A is a cross sectional view taken along line 3A—3A of FIG. 3.
Figure 3B:
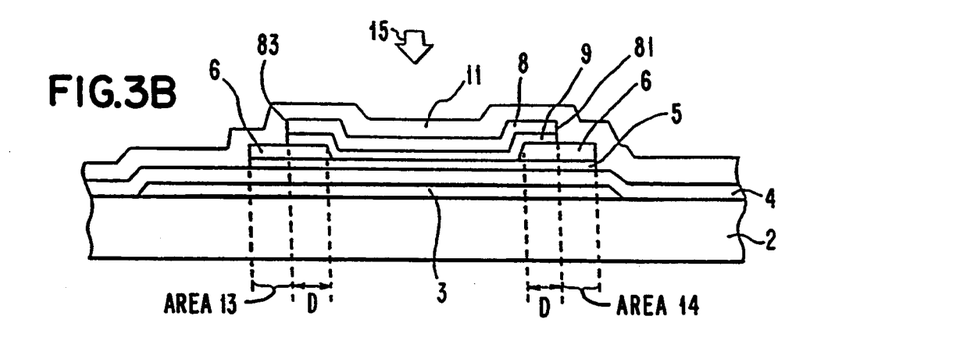
FIG. 3B is a cross sectional view taken along line 3B—3B of FIG. 3.
Figure 4:
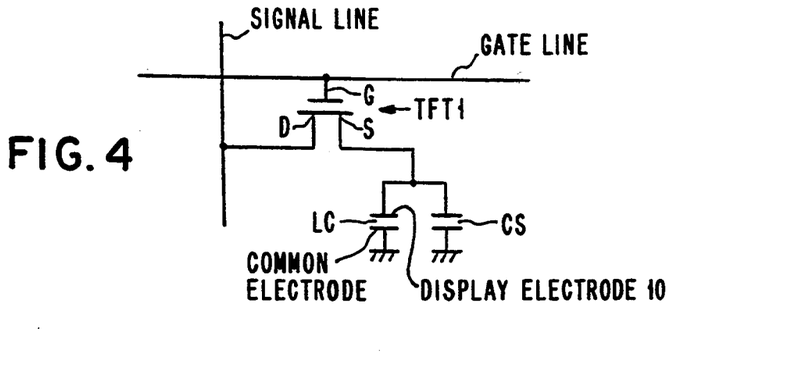
FIG. 4 is a schematic diagram of the circuit of a liquid crystal display cell.

FIG. 3 shows a plan view while FIGS. 3A and 3B show cross sections of a portion of one substrate of the structure of a first embodiment of a completed liquid crystal display cell according to the present invention. The other transparent insulating substrate is not shown since it is well-known in the art. A liquid crystal display cell is formed at each intersection of the gate and signal lines and has a thin film transistor (TFT) 1 and a display electrode 10. FIG. 4 shows the equivalent circuit of the liquid crystal display cell. When a gate pulse is applied to the gate line and a data signal, for example, +V is applied to the signal line, the TFT 1 is turned on, the data signal +V is applied to the display electrode 10, and a display is presented. The data signal +V is stored in a storage capacitor CS for one frame, and consequently the display is maintained for one frame. The storage capacitor CS is not shown in FIGS. 3, 3A or 3B.

Referring now to the cross-sectional structure of FIGS. 3A and 3B, the TFT 1 includes a light shielding gate electrode 3 formed on the surface of a transparent insulating substrate such as a glass substrate 2, a gate insulating layer 4 such as silicon oxide or silicon nitride, a semiconductor layer 5 such as intrinsic amorphous silicon and polycrystal silicon which forms a channel region of the TFT, a channel protective insulating layer 6 formed on a channel, a source electrode 7 and a drain electrode 8 connected to both ends of the semiconductor layer 5, an N+amorphous Si layer 9 formed between the source electrode 7 and the drain electrode 8 and the semiconductor layer 5, and a protective layer 11. Provided at the back of the glass substrate 2 is a light source, in which light is projected upward. The light source is not shown since it is well-known in the art.

In the first embodiment, the insulating layer 6 is formed between the source electrode 7 and the semiconductor layer 5 and between the drain electrode 8 and the semiconductor layer 5 over a distance D (which is longer than a hole-electron recombination distance) from all the edges of the source electrode 7 and the drain electrode 8 of the TFT 1, overlapping the semiconductor layer 5. To be more specific, all the edges of the source electrode 7 overlapping the semiconductor layer 5 are 71, 72, and 73, and all the edges of the drain electrode 8 overlapping the semiconductor layer 5 are 81, 82, and 83. The edges 82 and 72 are shown in FIG. 3A. When light is projected in the direction of an arrow 15 during the period when TFT 1 is turned off, holes and electrons are generated in the area 12 of the semiconductor layer 5 which is not covered by light blocking source and drain electrodes 7 and 8, and they move toward the connection area between the source electrode 7 and the semiconductor layer 5 and the connection area between the drain electrode 8 and the semiconductor layer 5. However, since the insulating layer 6 is formed between the semiconductor layer 5 and the source electrode 7 and between the semiconductor layer 5 and the drain electrode 8 for the distance D between these connection areas and the area 12, the holes and electrons are recombined within the distance D and do not reach the source electrode 7 and the drain electrode 8.

The edges 81 and 83 of the drain electrode 8 are shown in the cross section of FIG. 3B. When light is projected in the direction of an arrow 15 during the period when TFT 1 is turned off, holes and electrons are generated in the areas 13 and 14 of the semiconductor layer 5 which are not covered by the light shielding drain electrode 8, and they move toward the connection area between the drain electrode 8 and the semiconductor layer 5. However, since the insulating layer 6 is formed between the semiconductor layer 5 and the drain electrode 8 over the distance D between the connection area and the areas 13 and 14, the holes and electrons are recombined within the distance D and do not reach the drain electrode 8. The source electrode 7 also has a similar cross section, and the same result is achieved.

Thus, since the insulating layer 6 is formed between the source electrode 7 and the semiconductor layer 5 and between the drain electrode 8 and the semiconductor layer 5 for a distance D, which is longer than a hole-electron recombination distance, from all the edges, that is, 71, 72, and 73, and also 81, 82, and 83, of the source electrode 7 and the drain electrode 8 of the TFT 1 overlapping the semiconductor layer 5, leakage current between the source electrode 7 and the drain electrode 8 during the period when TFT 1 is turned off, is prevented. If a voltage of 10 to 15 volts is typically applied to the source and drain electrodes 7 and 8, since the hole-electron recombination distance is shorter than $1\mu$, the distance D is selected so as to be longer than this distance.

Referring to FIGS. 5A to 5J a process for manufacturing the structure of the first embodiment is shown. FIGS. 5A to 5J are successive cross sections taken along the plane of line 3A—3A of FIG. 3.

Figure 5A:
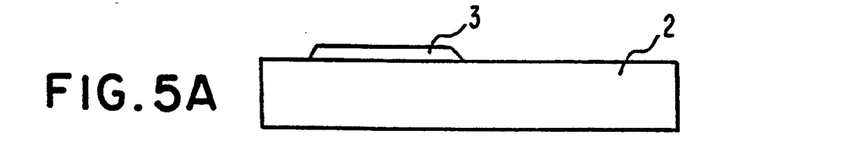
FIGS. 5A to 5J illustrate the manufacturing process for a TFT according to the present invention.
Figure 5B:
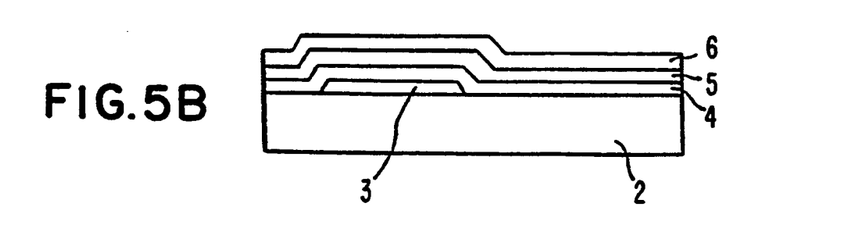
Figure 5C:
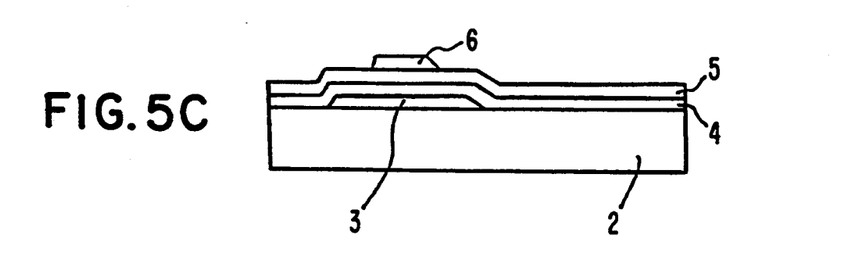
Figure 5D:
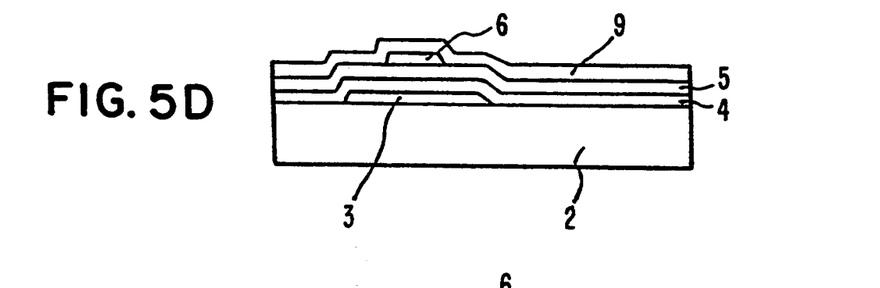
Figure 5E:
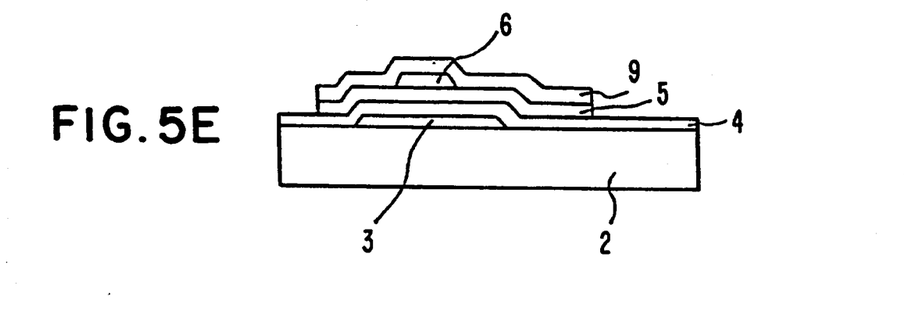

A molybdenum/tantalum (Mo/Ta) alloy is deposited on the glass substrate 2 and is etched using a mask in the shape of the gate lines and the gate electrode of FIG. 3, and thereby the gate lines and the gate electrode 3 are formed on the glass substrate (FIG. 5A). Then, a gate insulator film (oxide film) 4, an intrinsic amorphous silicon (i/a-Si) semiconductor layer 5, and a channel protective insulator film (nitride film) 6 are deposited over the entire surface (FIG. 5B). The channel protective insulating layer 6 is formed by etching using a mask in the shape of the channel protective insulator film 6 of FIG. 3 (FIG. 5C). The N+amorphous Si layer 9 is deposited over the entire surface of the substrate on which the channel protective insulator film 6 is formed (FIG. 5D). In the process of FIG. 5E, the N+amorphous Si layer 9 and the semiconductor layer 5 are formed by etching using a mask 50 shown by the thick line of FIG. 6.

Figure 5F:
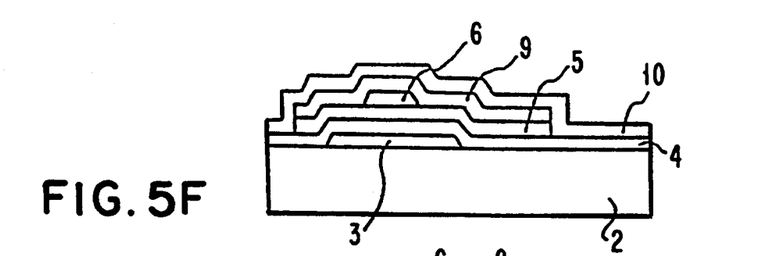
Figure 5G:
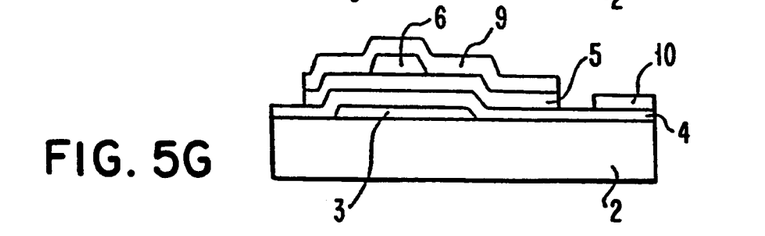
Figure 6:
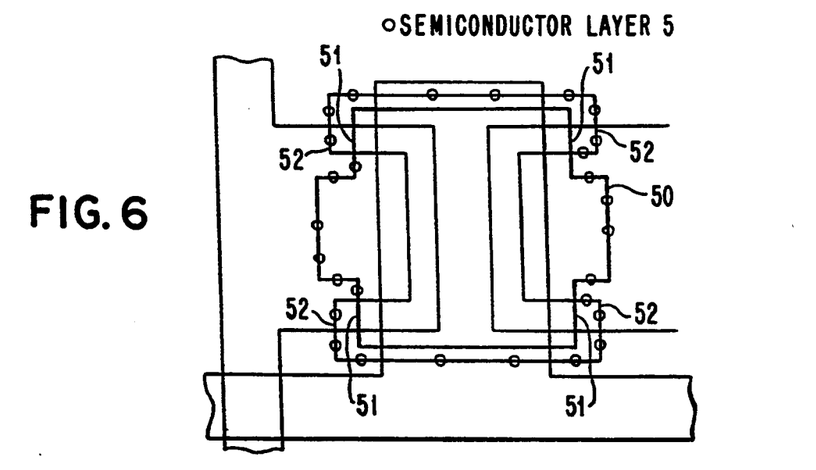
FIG. 6 is an enlarged plan view of a portion of a mask used in the process of FIG. 5(e) for manufacturing the TFT of the first embodiment of the invention.

The N+amorphous Si layer 9 is etched in the shape of the mask 50 (FIG. 6). However, since the channel protective insulating layer 6 exists on the semiconductor layer 5 and functions as a mask, the semiconductor layer 5 is etched as shown in FIG. 6. The position of an edge 51 of the mask 50 must not be outside an edge 52 of the channel protective insulating layer 6. If the edge 51 is outside the edge 52, a conductive path from the semiconductor layer 5 to the electrodes through the N+amorphous Si layer 9 is formed in the edges of the electrodes, and a path for leak current exists. ITO (indium tin oxide), a material used as a transparent display electrode, is deposited over the entire surface (FIG. 5F), and the display electrode 10 is formed by etching using a mask (FIG. 5G).

Figure 5H:
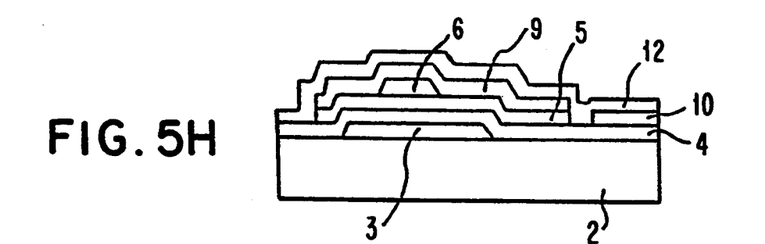
Figure 5I:
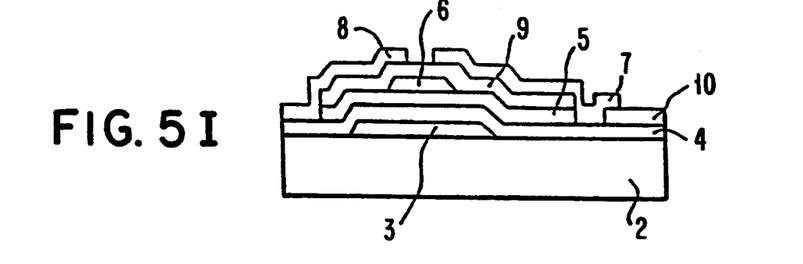
Figure 5J:
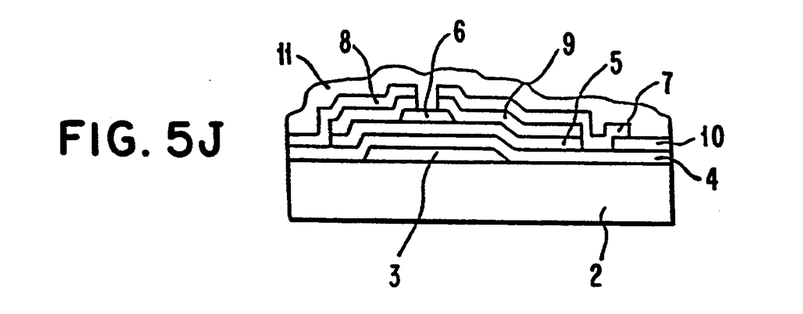

Aluminum is then deposited over the entire surface (FIG. 5H). The aluminum is etched using a mask, and the source electrode 7 and the drain electrode 8 (FIG. 3A) are formed (FIG. 5I). The display electrode 10 is connected to the TFT through the source electrode 7. Finally, by using the source electrode 7 and drain electrode 8 as a mask, the N+amorphous Si layer 9 which is not covered by these electrodes is etched (FIG. 5J), a protective film 11 such as a nitride film is deposited over the entire surface, and then an orientation layer (not shown) is deposited. In the process of FIG. 5J, since the channel protective insulating layer 6 exists on the semiconductor layer 5, the semiconductor layer 5 is not etched.

Figure 7:
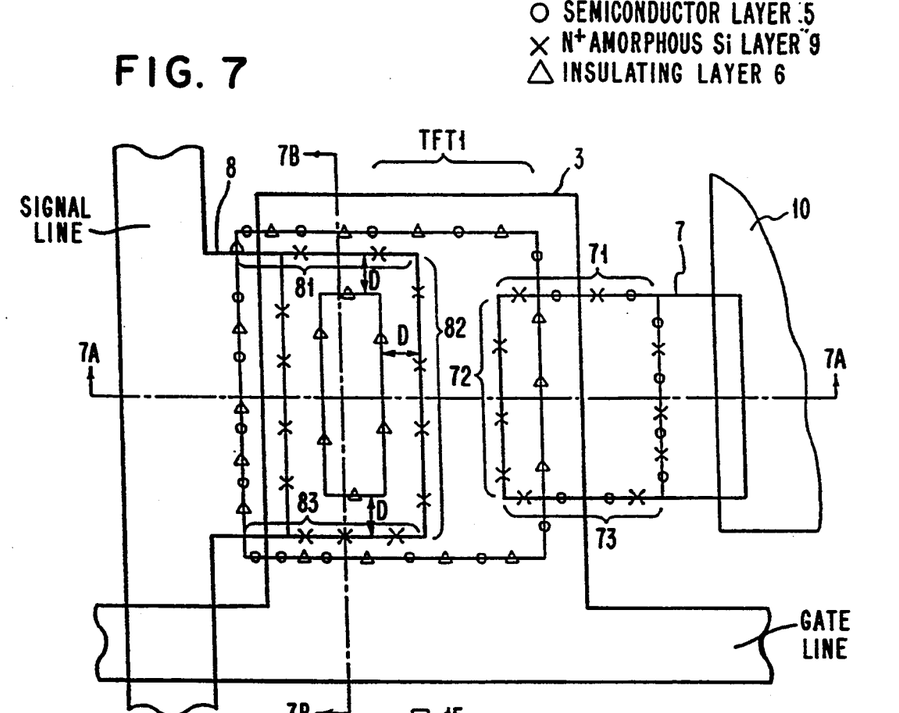
FIG. 7 is an enlarged plan view of a second embodiment of the TFT according to the present invention.
Figure 7A:
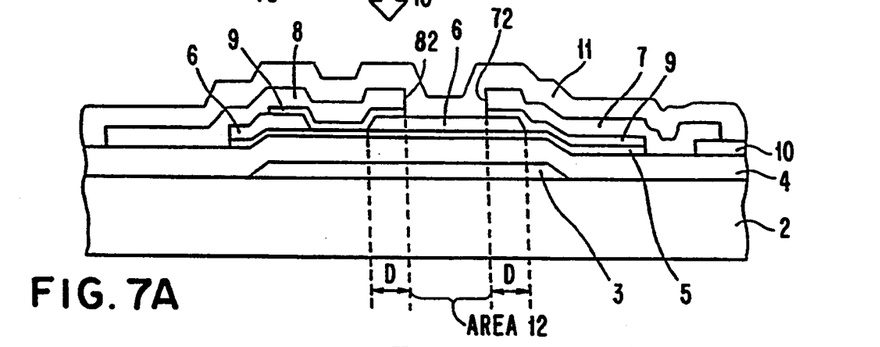
FIG. 7A is a cross sectional view of the embodiment of FIG. 7, taken along line 7A—7A of FIG. 7.
Figure 7B:
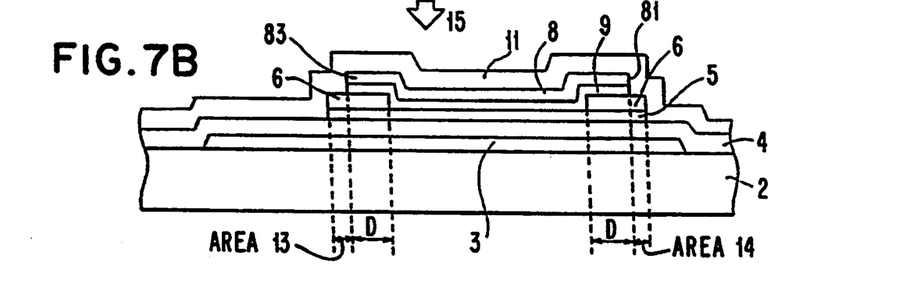
FIG. 7B is a cross sectional view of the embodiment of FIG. 7, taken along line 7B—7B of FIG. 7.

FIG. 7 shows a plan view, while FIGS. 7A and 7B show cross sections of a portion of one substrate of the structure of a second embodiment of a completed liquid crystal display cell according to the present invention. Since the path of leakage current has only to be cut in at least one place in order to prevent the leakage current from flowing source electrode 7 and drain electrode 8 during the period when TFT 1 is turned off, in the second embodiment, the insulating layer 6 is formed between the drain electrode 8 and the semiconductor layer 5 over a distance D (which is longer than a hole-electron recombination distance) from all the edges 81, 82, and 83 of one electrode of the TFT 1, for example, the drain electrode 8 overlapping the semiconductor layer 5. The same reference numbers as those of FIG. 3 are used in FIG. 7. When light is projected in the direction of an arrow 15 during the period when TFT 1 is turned off, holes and electrons are generated in the areas 12, 13, and 14 of the semiconductor layer 5 adjacent to the drain electrode 8, which are not covered by the light shielding drain electrode 8, and they move toward the connection area between the drain electrode 8 and the semiconductor layer 5. However, since the insulating layer 6 is formed between the semiconductor layer 5 and the drain electrode 8 over the distance D between the connection area and the areas 12, 13, and 14, the holes and electrons are recombined within the distance D and do not reach the drain electrode 8. Thus, leakage current does not flow.

Figure 8:
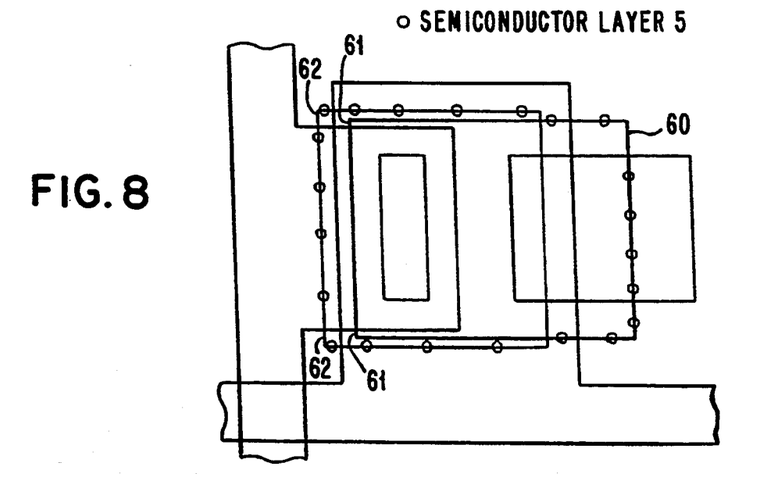
FIG. 8 is an enlarged plan view of a portion of a mask used in the process of FIG. 5(e) for manufacturing the TFT of the second embodiment of the invention.

A process for manufacturing the structure of the second embodiment is described by reference to FIGS. 5A to 5J. In the process of FIG. 5A, molybdenum/tantalum (mo/Ta) is deposited on a glass substrate 2, and gate lines and a gate electrode 3 are formed by using a mask in the shape of the gate lines and the gate electrode 3 of FIG. 7. In the process of FIG. 5B, a gate insulating layer (oxide film) 4, an intrinsic amorphous silicon (i/a-Si) semiconductor layer 5, and a channel protective insulating layer (nitride film) 6 are deposited over the entire surface. In the process of FIG. 5C, by using a mask in the shape of the insulating layer 6 of FIG. 7, the insulating layer is etched and the channel protective insulating layer 6 of FIG. 7 is formed. An aperture is formed in the insulating 6 for electrically connecting a drain electrode 8 to the semiconductor layer 5. The cross section of this aperture is shown in FIGS. 7A and 7B. In the process of FIG. 5D, an N+amorphous Si layer 9 is deposited. In the process of FIG. 5E, the N+amorphous Si layer 9 and the semiconductor layer 5 are formed by etching using a mask 60 shown by the thick line of FIG. 8. The N+amorphous Si layer 9 is etched in the shape of the mask 60. However, since the channel protective insulating layer 6 is on the semiconductor layer 5 and functions as a mask, the semiconductor layer 5 is etched as shown in FIG. 8. An edge 61 of the mask 60 must not be located past an edge 62 of the channel protective insulating layer 6. If the edge 61 is outside the edge 62, a conductive path from the semiconductor layer 5 to the drain electrode 8 through the N+amorphous Si layer 9 is formed at the edge of the drain electrode 8, and a path for leakage current is established.

In the process of FIG. 5F, ITO a material for a transparent display electrode, is deposited over the entire surface. In the process of FIG. 5G, a display electrode 10 is formed by etching using a mask. In the process of FIG. 5H, aluminum is deposited. In the process of FIG. 5I, the aluminum is etched by using a mask in the shape of the drain electrode 8 and the source electrode 7 of FIG. 7, and the drain electrode 8 and a source electrode 7 are formed. In the process of FIG. 5J, by using the drain electrode 8 and the source electrode 7 as a mask, the N+amorphous Si layer 9 and the semiconductor layer 5 which are not covered by these electrodes are etched. Then, a protective film 11 such as a nitride film is deposited, and an orientation layer (not shown) is deposited.

The source electrode of the second embodiment can be formed of a transparent material such as ITO (indium tin oxide). In this case, in the process of FIG. 5G, the source electrode 7 is integrally formed with the display electrode 10. This structure has an advantage in that aperture ratio is improved because the display area is increased in size.

It will be appreciated that the structure of the present invention may be applied to a reflection type active matrix liquid crystal display device having a reflecting plate instead of a light source.

Thus, when an N+amorphous Si layer is removed from a channel region of a TFT in the process of FIG. 5J, an insulating layer 6 according to the present invention not only prevents semiconductor layer 5 serving as this channel, from being etched, but also prevents leakage current caused by holes and electrons generated due to incident light.

What is claimed is:

1. In a thin film transistor including a light shielding gate electrode formed on a transparent insulating substrate, a gate insulating layer formed on the gate electrode, a semiconductor layer formed on the gate insulating layer, and a light shielding source electrode and a light shielding drain electrode connected to said semiconductor layer for defining a channel region, the improvement comprising:
an insulating layer overlapping said semiconductor layer between one of said source and drain electrodes and said semiconductor layer over a distance, which is longer than a hole-electron recombination distance, from all edges of at least one of said source and drain electrodes.

2. The thin film transistor according to claim 1, wherein said insulating layer extends onto the channel region of said semiconductor layer.

3. The thin film transistor of claim 1 wherein said insulating layer overlaps said semiconductor layer so that said distance is larger than said hole-electron recombination distance from all edges of said source and drain electrodes.

4. The thin film transistor according to claim 3, wherein said insulating layer extends onto the channel region of said semiconductor layer.

5. An active matrix liquid crystal display device comprising a first transparent insulating substrate having a plurality of gate lines disposed in a first direction, a plurality of signal lines disposed in a direction intersecting said first direction, and a thin film transistor, and a display electrode connected to each of the intersections of said gate and signal lines;
a second transparent insulating substrate having a common electrode;
a liquid crystal materials maintained between said first and second transparent insulating substrates;
means connected to said gate lines for applying gate signals to said gate lines; and
means connected to said signal lines for applying data signals to said signal lines;
wherein said thin film transistor includes a light shielding gate electrode formed on said first transparent insulating substrate, a gate insulating layer formed on the gate electrode, a semiconductor layer formed on the gate insulating layer, and a light shielding source electrode and a light shielding drain electrode connected to said semiconductor layer for defining a channel region; and
an insulating layer, overlapping said semiconductor layer between one of said source and drain electrodes and said semiconductor layer over a distance, which is longer than a hole-electron recombination distance, from all the edges of at least one of said source and drain electrodes.

6. The active matrix liquid crystal display device according to claim 5, wherein said insulating layer extends onto the channel region of said semiconductor layer.

7. The active matrix liquid crystal display device of Claim 6 wherein said insulating layer overlaps said semiconductor layer so that said distance is longer than said hole-electron recombination distance from all edges of said source and drain electrodes.

* * * * *